US005281836A

United States Patent [19]

Mosser et al.

[11] Patent Number: 5,281,836

[45] Date of Patent: Jan. 25, 1994

[54] SEMICONDUCTOR SENSOR WITH PERPENDICULAR N AND P-CHANNEL MOSFET'S

[75] Inventors: Vincent Mosser, Vanves; Jan Suski, Antony, both of France

[73] Assignee: Schlumberger Industries, Montrouge, France

[21] Appl. No.: 844,616

[22] PCT Filed: Oct. 15, 1990

[86] PCT No.: PCT/FR90/00736

§ 371 Date: Apr. 9, 1992

§ 102(e) Date: Apr. 9, 1992

[87] PCT Pub. No.: WO91/06125

PCT Pub. Date: May 2, 1991

[30] Foreign Application Priority Data

Oct. 13, 1989 [FR] France ............................ 89 133383

[51] Int. Cl.[5] ..................... H01L 29/66; H01L 29/96; H01L 29/84; H01L 27/02

[52] U.S. Cl. .................................. 257/254; 257/274; 257/369; 257/417; 257/419; 73/517 R; 73/517 B; 73/726

[58] Field of Search .................... 357/25, 26; 361/283; 257/274, 369, 417, 418, 419:254, 469, 470; 73/517 R, 517 B, 726, 727

[56] References Cited

U.S. PATENT DOCUMENTS

| | | | |
|---|---|---|---|
| 3,492,861 | 2/1970 | Jund | 357/26 |
| 3,624,315 | 11/1971 | Broce et al. | 357/26 |
| 4,894,698 | 1/1990 | Hijikigawa et al. | 357/25 |
| 4,965,697 | 10/1990 | Mosser et al. | 361/283 |
| 5,115,292 | 5/1992 | Takebe et al. | 357/27 |

FOREIGN PATENT DOCUMENTS

| | | | |
|---|---|---|---|
| 40795 | 12/1981 | European Pat. Off. . | |
| 2143553 | 2/1973 | France . | |
| 59-117173 | 7/1984 | Japan | 357/26 |
| 2011707 | 2/1973 | United Kingdom . | |

OTHER PUBLICATIONS

Article by Neumeister et al., Jul. 1985, vol. 7, No. 3, *Sensors and Actuators*, pp. 167-175, "A Silicon Pressure Sensor Using MOS Ring Oscillators".

*Primary Examiner*—William Mintel
*Assistant Examiner*—Mahshid Saadat
*Attorney, Agent, or Firm*—Dale V. Gaudier

[57] ABSTRACT

The invention relates to sensors having field effect semiconductors. The sensor of the invention comprises a ring oscillator constituted by an odd number of CMOS inverters disposed in a zone sensitive to the physical property to be measured. In order to increase the sensitivity of the sensor, the N channel of the NMOS transistor in each CMOS inverter is disposed perpendicularly to the P channel of the PMOS transistor.

7 Claims, 3 Drawing Sheets

SEMICONDUCTOR SENSOR WITH PERPENDICULAR N AND P-CHANNEL MOSFET'S

The invention relates to the field of sensors using field effect semiconductor devices. It relates more particularly to a sensor for measuring a physical (i.e. non-electrical) property such as pressure, stress, deformation, temperature, etc. . . . , and constituted in the form of a ring oscillator using metal oxide semiconductor field effect transistors (MOSFETs).

BACKGROUND OF THE INVENTION

It has long been known that silicon, the base material from which MOSFETs are made, has piezoresistive properties that are of interest in the field of sensors.

Also known, e.g. from European patent EP-B-0 040 795, is a semiconductor sensor comprising an odd number of complementary metal oxide semiconductor (CMOS) inverters disposed in a zone which is sensitive to pressure, the inverters being inter connected to form a pressure sensitive ring oscillator. The frequency of the oscillator obtained in this way is directly related to the stress to which the semiconductor devices are subjected under the effect of pressure.

An object of the invention is thus to provide a semi conductor sensor having very good sensitivity while maintaining a relatively low cost price. Another object is to eliminate sensor drift under the effect of temperature and to improve the yield of the manufacturing process by reducing the number of rejects.

SUMMARY OF THE INVENTION

The sensor of the invention comprises a ring oscillator made up from an odd number of CMOS inverters disposed in a zone which is sensitive to the physical property which is to be measured; for each CMOS inverter, the N channel of the NMOS transistor is substantially perpendicular to the P channel of the PMOS transistor. This serves to increase sensor sensitivity by about 15% to 20% compared with a parallel disposition.

The sensitive zone may in particular take the form of a deformable membrane; in which case the physical property to be measured is pressure.

In various particular embodiments, the sensor comprises at least one pair of ring oscillators so as to reduce sensor drift related to temperature variations.

In a particularly advantageous embodiment, the sensitive zone of the sensor is provided with a plurality of ring oscillator pairs, thereby reducing the number of rejects during the manufacturing process.

In order to obtain more complete elimination of an interfering physical property such as temperature, the sensor may also be provided with at least one additional oscillator which is sensitive solely to said interfer physical property, thereby serving as a reference.

BRIEF DESCRIPTION OF THE DRAWINGS

Embodiments of the invention are described by way of example with reference to the accompanying drawings, in which.

DETAILED DESCRIPTION

The sensor of the invention is made from a wafer of silicon which includes a zone that is sensitive to the physical property to be measured. In the particular embodiments described below, this zone is constituted by a membrane which is sensitive to pressure. It will readily be understood that the sensitive zone could also be the surface of a simple beam and that the physical property to be measured could be stress or else deformation.

Figure 1A:
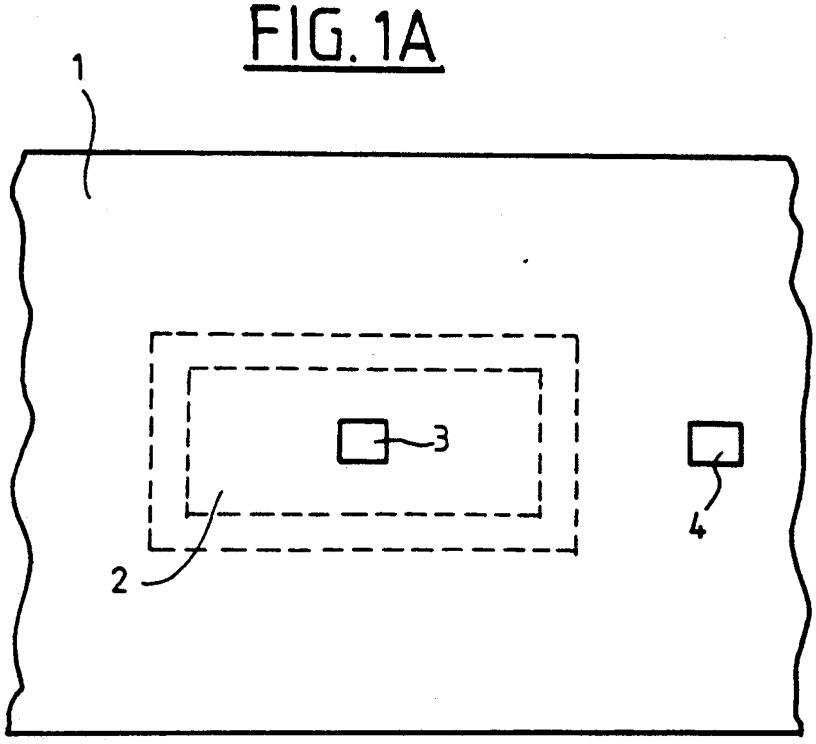
FIGS. 1A and 1B are respectively a plan view and a section view of a first embodiment constituting a pressure sensor.
Figure 1B:
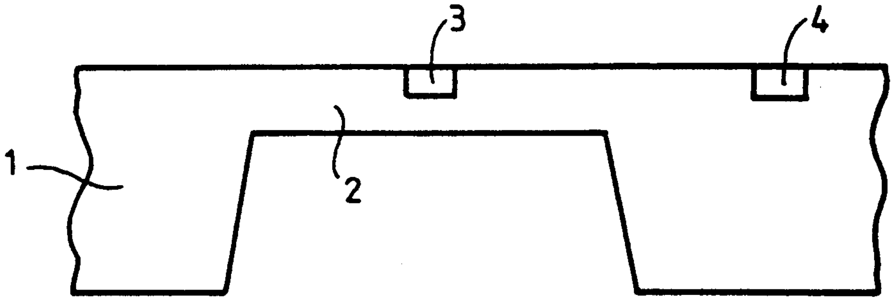

In a first embodiment shown in FIGS. 1A and 1B the silicon wafer 1 is oriented in the (100) plane and includes a rectangular pressure-sensitive membrane 2 with a ring oscillator 3 disposed in the center thereof. The oscillator 3 comprises an odd number of CMOS inverters, e.g. 89 inverters giving an oscillation frequency of about 1 MHz. For further details concerning a ring oscillator such as the oscillator 3, reference may be made in particular to Chapter 8 entitled "Analog Basic Circuits" in the book "Mc MOS Handbook" published in 1973 by the semiconductor products division of Motorola Inc. Reference may also be made to the work entitled (in translation) "Semiconductor integrated circuits and devices" by A. Vapaille and R. Castagne, 1987 (pp. 453 and 454) on how to make an inverter using CMOS technology.

Each CMOS inverter comprises at least one NMOS transistor and at least one PMOS transistor, with the N channel of the NMOS transistor being in alignment with the $[\bar{1}\bar{1}0]$ crystal axis, and with the P channel of the PMOS transistor being in alignment with the [110] axis so that the N channel is perpendicular to the P channel.

Work undertaken by the Applicant has shown that when the N channel is perpendicular to the P channel, e.g. when the N channel follows the longitudinal axis $[\bar{1}\bar{1}0]$ and the P channel follows the transverse axis [110] or vice versa, for example, then the sensitivity of the sensor is increased by about 15% to 20% compared with a parallel configuration.

Figure 2A:
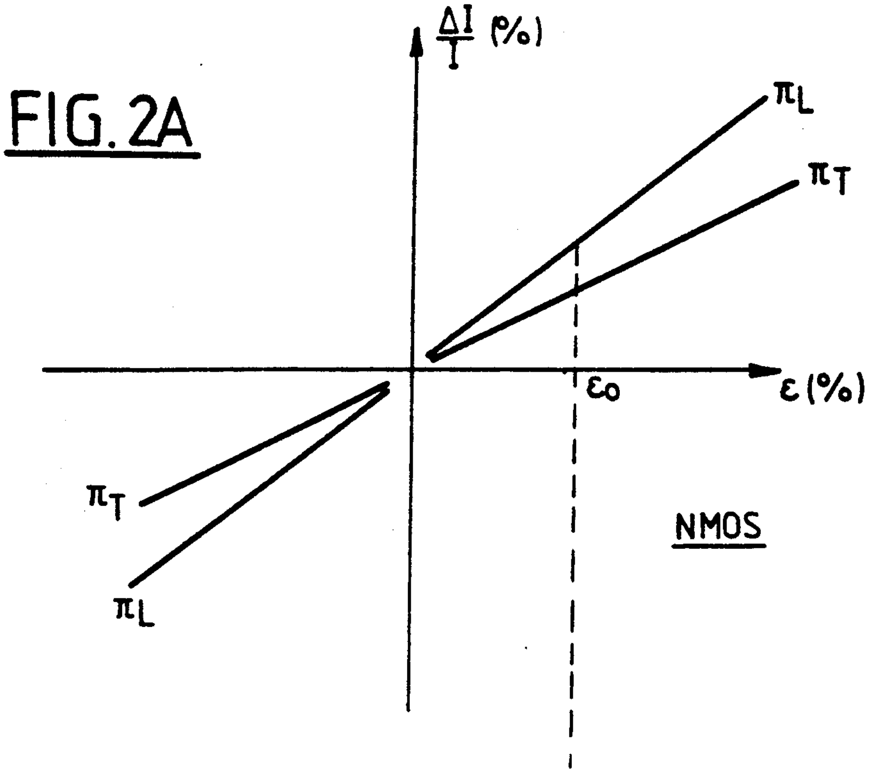
FIGS. 2A and 2B are diagrams showing the piezoresistive coefficients of NMOS and PMOS transistors respectively.
Figure 2B:
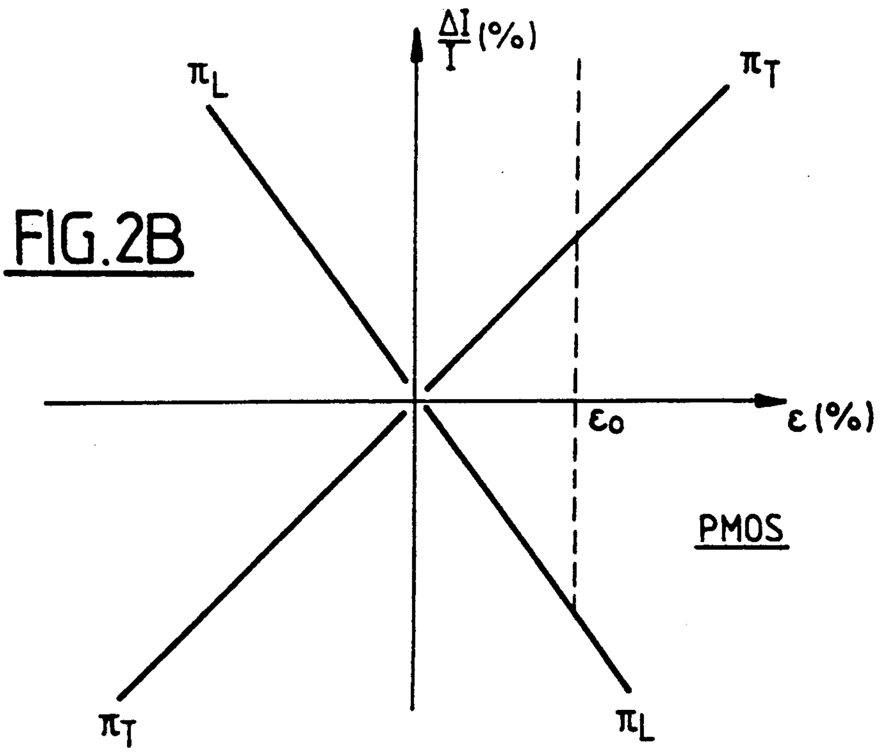

This increase in sensitivity may be explained by referring to FIGS. 2A and 2B which show the piezoresistive effect, i.e. the variation in the current $\Delta I/I$ flowing through the transistor as a function of deformation $\epsilon$ for NMOS and PMOS transistors respectively. It should particularly be observed firstly that the piezoresistive effect depends greatly on transistor type and secondly that it is anisotropic, given the difference that exists between the coefficients of piezo resistivity $\pi_L$ and $\pi_T$ taken respectively along the longitudinal axis [110] and the transverse axis $[\bar{1}\bar{1}0]$ of the (100) plane of the silicon crystal. Since the crystal structure of silicon is cubic, this analysis could naturally be applied equally well to the family of (100) planes associated with the $<110>$ family of crystal axes.

For given deformation $\epsilon_o$, the response of a CMOS inverter corresponds substantially to the sum of the responses of its NMOS and PMOS transistors. Regardless of whether the deformation is positive or negative, i.e. whether it is in the form of an elongation or of a compression, it can be seen that the algebraic sum of the responses of the NMOS and PMOS transistors is greater when one of the two transistors is subjected to a longitudinal stress and the other to a transverse stress, than in the case where both transistors are simultaneously subjected either to a longitudinal stress or to a transverse stress.

Nevertheless, the first embodiment described with reference to FIGS. 1A and 1B suffers from a drawback in that the frequency delivered by the oscillator is highly dependent of the temperature of the membrane.

In order to remedy this drawback, various solutions are available. One of these solutions consists in adding a second oscillator 4 referred to as a reference oscillator, which is substantially identical to the oscillator 3 and which is disposed in a zone that is not subjected to the physical property to be measured, i.e. to pressure in this case. The frequency delivered by the oscillator 4 is directly related to the temperature of the silicon wafer 1 and as a result the oscillator 4 constitutes a temperature sensor. By suitably processing the signals obtained from the frequencies delivered by the oscillators 3 and 4, e.g. by comparing these two frequencies or simply making a ratio of the two frequencies, it is possible to obtain a signal which is representative of pressure and independent of temperature.

Another solution consists in disposing two oscillators on the membrane itself. This second solution may itself be implemented in two different ways referred to below respectively as the second embodiment and as the third embodiment.

Figure 3:
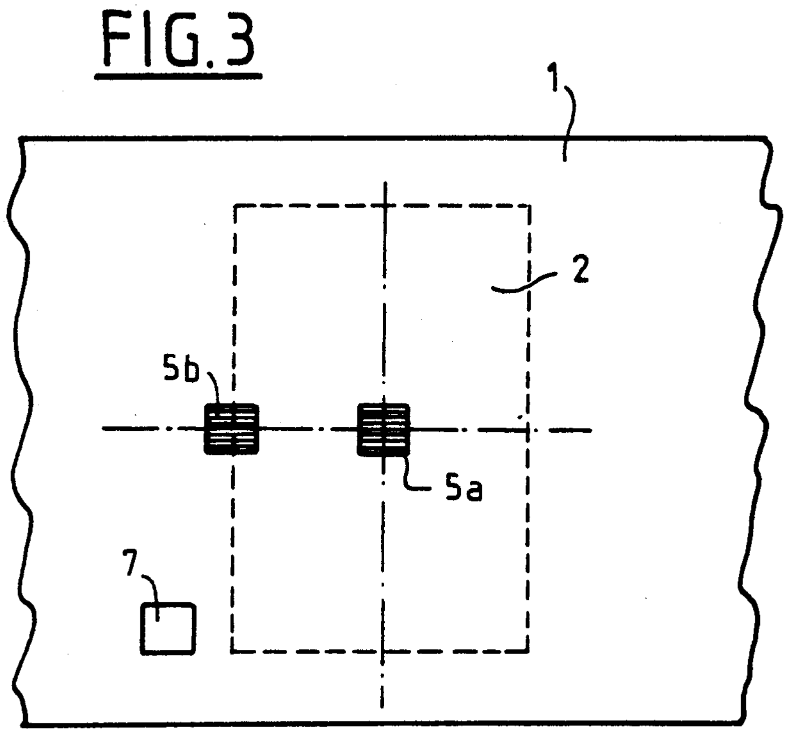
FIG. 3 is a plan view of a second embodiment of a pressure sensor including a pair of ring oscillators.

As shown in FIG. 3, the two oscillators **5*a* and 5*b* in the second embodiment are parallel to each other, i.e. the N and P channels of the oscillator 5*a* are parallel with the N and P channels respectively of the oscillator 5*b*, with one of the oscillators being disposed at the center of the membrane 2 and with the other being disposed substantially at the periphery of the membrane 2**. The stresses in these two locations due to a given deformation of the membrane are substantially equal but of opposite sign the frequency of one of the two oscillators will be observed to increase while that of the other decreases. Since the temperature sensitivity of both oscillators is substantially identical the influence of temperature on the measurement can be considerably reduced by making the ratio of the two frequencies.

In a manner similar to that described with reference to the first embodiment, it is also possible to add a third ring oscillator 7, referred to as a "reference" oscillator which is substantially identical to the oscillators 3 and 4 and is disposed away from the pressure-sensitive membrane 2. The oscillator 7 thus constitutes a temperature sensor which makes it possible, using suitable digital processing known to the person skilled in the art, to compensate pressure measurements completely for variations in temperature.

Figure 4:
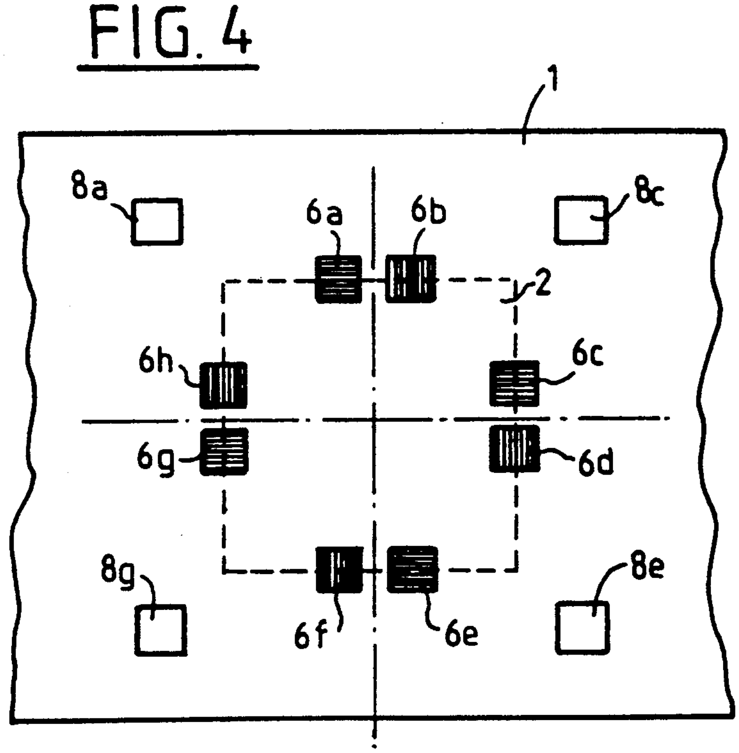
FIG. 4 is a plan view of a third embodiment comprising four pairs of ring oscillators.

The third embodiment shown in FIG. 4 constitutes the preferred embodiment. Two oscillators **6*a* and 6*b* are perpendicular to each other and disposed side by side in a substantially peripheral zone of the membrane 2. In other words the N and P channels of the oscillator 6*a* are perpendicular to the N and P channels respectively of the oscillator 6*b***. Temperature drift can be practically eliminated by making the ratio of the frequencies delivered by the two oscillators.

A possible improvement consists in disposing four pairs of oscillators **6*a* and 6*b*, 6*c* and 6*d*, 6*e* and 6*f*, and 6*g* and 6*h*** on respective ones of the four sides of a square membrane. Should it turn out that one, two, or even three of the pairs of oscillators are faulty for manufacturing reasons, there still remains a fourth pair of oscillators capable of constituting the sensor. The redundant nature of this improvement has the effect of increasing the yield of the manufacturing process very considerably. Further, it is highly advantageous since manufacturing cost is generally a function of the area of the silicon wafer being processed.

Another possible improvement, similar to that described with reference to the first two embodiments, consists in adding one or more oscillators **8*a*, 8*c*, 8*e*, and 8*g*** disposed off the pressure sensitive membrane and serving to measure temperature so as to enable residual temperature drift to be corrected.

We claim:

1. A semiconductor sensor for measuring a physical property, the sensor comprising at least one ring oscillator constituted by an odd number of CMOS inverters, each including an NMOS transistor with an N channel and a PMOS transistor with a P channel, the oscillator being disposed in a zone sensitive to the physical property in such a manner that the frequency of said oscillator is representative of said physical property, wherein the N channel of the NMOS transistor in each CMOS inverter is substantially perpendicular to the P channel of the PMOS transistor.

2. A sensor according to claim 1, wherein said sensitive zone is a membrane and said physical property is pressure.

3. A sensor according to claim 2, comprising two ring oscillators oriented in parallel with each other, one of the two oscillators being disposed in the center of the membrane while the other is disposed substantially at the periphery of the membrane.

4. A sensor according to claim 2, comprising at least one pair of ring oscillators disposed side by side substantially at the periphery of the membrane and oriented perpendicularly relative to each other.

5. A sensor according to claim 4, wherein the membrane is substantially square.

6. A sensor according to claim 5, comprising four pairs of oscillators disposed on respective ones of the four sides of the square membrane.

7. A sensor according to claim 1, further including at least one ring oscillator disposed in a zone which is not sensitive to said physical property to be measured and which serves as a reference oscillator.

* * * * *